United States Patent
Philipp

(10) Patent No.: US 11,094,510 B2
(45) Date of Patent: Aug. 17, 2021

(54) ECR ION SOURCE AND METHOD FOR OPERATING AN ECR ION SOURCE

(71) Applicant: Dreebit GmbH, Großröhrsdorf (DE)

(72) Inventor: Alexandra Philipp, Lohmen (DE)

(73) Assignee: Dreebit GmbH, Grossröhrsdorf (DE)

( * ) Notice: Subject to any disclaimer, the term of this patent is extended or adjusted under 35 U.S.C. 154(b) by 8 days.

(21) Appl. No.: 16/869,001

(22) Filed: May 7, 2020

(65) Prior Publication Data
US 2020/0357614 A1 Nov. 12, 2020

(30) Foreign Application Priority Data
May 8, 2019 (DE) ...................... 10 2019 111 908.1

(51) Int. Cl.
H01J 37/32 (2006.01)
H05H 1/46 (2006.01)

(52) U.S. Cl.
CPC .... *H01J 37/32678* (2013.01); *H01J 37/3222* (2013.01); *H01J 37/32201* (2013.01); *H01J 37/32293* (2013.01); *H05H 1/46* (2013.01)

(58) Field of Classification Search
None
See application file for complete search history.

(56) References Cited

U.S. PATENT DOCUMENTS

| | | | |
|---|---|---|---|
| 4,792,732 A | 12/1988 | O'Loughlin | |
| 4,851,668 A * | 7/1989 | Ohno | H01J 27/16 250/251 |
| 5,146,137 A | 9/1992 | Gesche et al. | |
| 5,168,197 A * | 12/1992 | Tamba | H01J 27/16 204/298.38 |
| 5,282,899 A * | 2/1994 | Balmashnov | H01L 21/3006 118/719 |

(Continued)

FOREIGN PATENT DOCUMENTS

DE 10 2008 027 363 A1 12/2009
EP 0 459 177 A2 4/1991

(Continued)

OTHER PUBLICATIONS

Takuto Watanabe et al.: "Wireless telegram microwave ECRIS". AIP Conference Proceedings, vol. 2011, Sep. 21, 2018, (Sep. 21, 2019), p. 090019-1-090019-3.

(Continued)

*Primary Examiner* — Amy Cohen Johnson
*Assistant Examiner* — Srinivas Sathiraju
(74) *Attorney, Agent, or Firm* — Ursula B. Day, Esq.

(57) ABSTRACT

An ECR (Electron Cyclotron Resonance) ion source includes a plasma chamber having a circular cylindrical cross-section, magnets for generating a magnetic field for confinement of the plasma in the plasma chamber, and a microwave generator disposed outside the plasma chamber and generating at least two microwave signals. Several antennas protrude radially into the plasma chamber with a predetermined angular offset α. The antennas receive phase-shifted microwave signals from the microwave generator and radiate linearly polarized microwaves, which in turn produce a circularly polarized microwave inside the plasma chamber. A method for operating an ECR ion source is also described.

5 Claims, 1 Drawing Sheet

(56) References Cited

U.S. PATENT DOCUMENTS

| | | | | |
|---|---|---|---|---|
| 5,397,962 | A * | 3/1995 | Moslehi | H05H 1/46 315/111.51 |
| 5,841,237 | A * | 11/1998 | Alton | H01J 27/18 315/111.81 |
| 6,184,624 | B1 * | 2/2001 | Inouchi | H01J 27/18 118/723 MA |
| 6,293,090 | B1 * | 9/2001 | Olson | F03H 1/0081 313/231.31 |
| 6,334,302 | B1 * | 1/2002 | Chang-Diaz | F03H 1/0093 60/203.1 |
| 6,803,585 | B2 * | 10/2004 | Glukhoy | H01J 27/18 250/423 R |
| 6,812,647 | B2 * | 11/2004 | Cornelius | H01J 37/08 315/111.41 |
| 6,922,019 | B2 * | 7/2005 | Leung | H01J 27/18 250/492.3 |
| 7,183,514 | B2 * | 2/2007 | Kamarehi | H01J 37/32192 118/723 MW |
| 7,497,922 | B2 * | 3/2009 | Kumar | B01J 19/088 156/345.41 |
| 8,624,502 | B2 * | 1/2014 | Rosenthal | H01J 27/18 315/111.81 |
| 9,659,736 | B2 * | 5/2017 | Rosenthal | H01J 37/08 |
| 9,852,873 | B2 * | 12/2017 | Delferriere | H01J 27/024 |
| 2007/0056515 | A1 | 3/2007 | Chevalier et al. | |
| 2009/0309046 | A1 * | 12/2009 | Balakin | A61N 5/1049 250/492.3 |
| 2010/0175833 | A1 | 7/2010 | Nishio | |
| 2011/0150180 | A1 * | 6/2011 | Balakin | G21K 1/087 378/65 |
| 2015/0217140 | A1 * | 8/2015 | Balakin | A61N 5/1077 600/1 |
| 2017/0104426 | A1 * | 4/2017 | Mills | H02S 10/10 |

FOREIGN PATENT DOCUMENTS

| | | |
|---|---|---|
| EP | 0 434 933 A2 | 7/1991 |
| WO | WO 94/03919 A1 | 2/1994 |
| WO | WO2006/100217 A1 | 9/2006 |
| WO | WO2010/132069 A1 | 11/2010 |

OTHER PUBLICATIONS

M. Liehr et al.: "A low power 2.45 GHz ECR ion source for multiply charged ions", Review of Scientific Instruments, vol. 63, No. 4, Apr. 1, 1992 (Apr. 1, 1992), pp. 2541-2543.

Yushi Kato et al.: "Production of multicharged ions in a 2.45 GHz electron cyclotron resonance source directly excited in a circular $TE_{01}$ mode cavity resonator", Review of Scientific Instruments, AIP, Melville, NY, US, vol. 75, No. 5, May 1, 2004 pp. 1470-1472.

Kouta Hamada et al.: "Enhancement of Beam Intensity in Electron Cyclotron Resonance Plasma by DC Biased Plate-Tuner", 2018 $22^{nd}$ International Conference on Ion Implantation Technologuy (IIT), IEEE, Sep. 16, 2018 (Sep. 16, 2018), pp. 219-222.

* cited by examiner

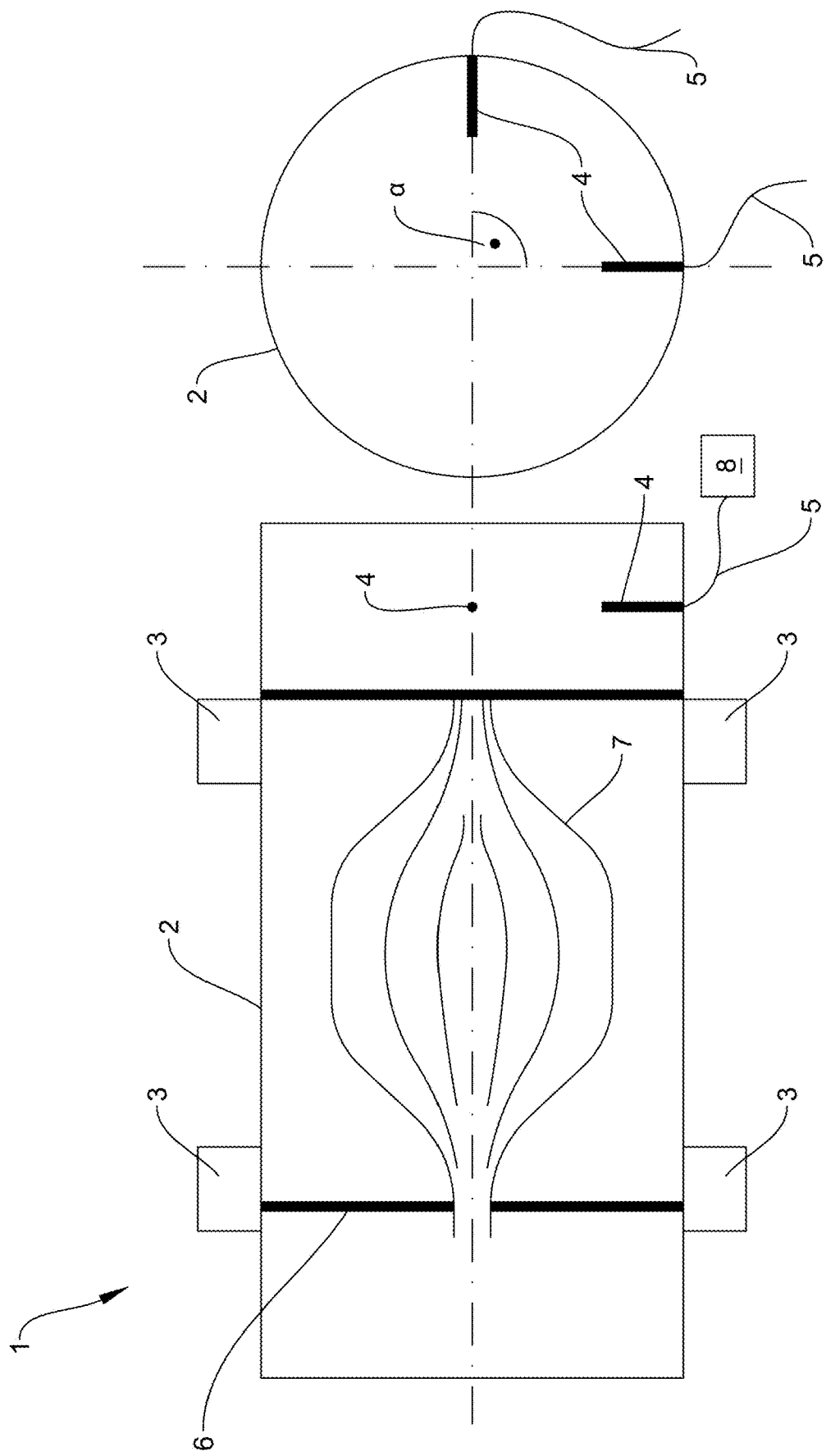

ECR ION SOURCE AND METHOD FOR OPERATING AN ECR ION SOURCE

CROSS-REFERENCES TO RELATED APPLICATIONS

This application claims the priority of German Patent Application, Serial No. 10 2019 111 908.1, filed May 8, 2019, pursuant to 35 U.S.C. 119(a)-(d), the disclosure of which is incorporated herein by reference.

BACKGROUND OF THE INVENTION

The invention relates to a multi-antenna microwave feed with a tuned phase shift for ECR ion sources and to a method for generating circularly polarized microwaves. Electron Cyclotron Resonance (ECR) refers to the superposition of electromagnetic microwaves in a static magnetic field, wherein the static magnetic field is perpendicular to the alternating electric field of the microwave and the frequency of the supplied microwave corresponds to the gyration frequency of electrons in a magnetic field.

The areas of application for ECR are diverse. ECR plasmas are used, for example, to weld components or to coat films, as well as an ion source in particle therapy systems for tumor radiation in medical technology.

To produce plasmas in ECR ion sources, microwave radiation is fed into a cylindrical resonator chamber, the plasma chamber, and used to heat electrons. The electrons are accelerated by energy transfer from the radiation and collide with atoms and ions, whereupon new free electrons and positively charged ions with a successively increasing state of charge are generated.

Various approaches for using the microwave radiation in ECR ion sources are known in the prior art.

For example, it is known to feed linearly polarized microwaves directly into the plasma chamber with one or more antennas; however, disadvantageously, there is no increase in the power transfer efficiency.

For example, U.S. Pat. No. 5,841,237 A discloses an apparatus and a method for the production of large resonant plasma volumes in microwaves with Electron Cyclotron Resonance—ion sources. A plurality of linearly polarized microwaves is fed into a cylinder-shaped resonator chamber, with the microwaves having different frequencies. This makes it possible to use several resonance zones within a cavity, which increases the plasma yield and influences the plasma composition.

Furthermore, WO 2010/132069 A1 discloses an ion source which also introduces microwaves for the ECR-method into the radiation source via a waveguide.

WO 2006/100217 A1 discloses a photon source based on an ECR ion plasma source is, wherein the microwaves are also injected into the plasma vacuum chamber via a waveguide.

In addition to the use of linearly polarized microwaves, it is known that circularly polarized microwaves have a positive effect on the efficiency of the ECR process.

For example, it is known to feed circularly polarized waves into the plasma chamber, with the circular polarization of the microwaves being performed outside the plasma chamber, which necessitates the use of waveguides for transporting the waves. Because thanks to technological advancements, semiconductor generators having coaxial outputs are increasingly used for generating microwaves, applications using waveguides may have a more complex design and may therefore be disadvantageous.

For example, EP 0 434 933 A2 discloses such device for generating a plasma using microwaves wherein a plasma is generated using circularly polarized microwaves. The linearly polarized microwave coming from a microwave generator is converted into a circularly polarized wave using a mode converter and a standard circular waveguide, and then supplied by way of a horn to the cross section of a plasma chamber. The circularly polarized microwaves are thus generated outside the resonator space and the circularly polarized microwaves have to be transported with complex equipment via waveguides and fed into the resonator space.

The ECR ion sources according to the prior art have in common that the feed of microwaves is used to heat electrons and to generate and improve the plasma.

The approaches pursued in this case are, on the one hand, to inject linearly polarized microwaves into the plasma chamber or to introduce already circularly polarized microwaves via a waveguide into the plasma chamber from the outside, wherein a further component generating the circular polarization is inserted between the generator and the chamber.

The existing problems can be seen in the need for increasing the efficiency of the power transfer from microwave radiation to electrons in ECR ion sources with a prescribed microwave frequency, microwave power and cavity geometry. As another disadvantage, available microwave generators do not directly supply circularly polarized microwaves.

SUMMARY OF THE INVENTION

It is an object of the invention to generate circularly polarized microwaves in the ECR ion source with less complexity and reduced energy consumption and to make them available for heating the electrons.

The object is achieved with an ECR ion source and a method for operating the ECR ion source with the features of the independent claims. Further embodiments are recited in the dependent claims.

The object of the invention is solved in particular with an ECR ion source having a circular cylindrical plasma chamber and magnets for generating a magnetic field for confining the plasma in the plasma chamber. Furthermore, a microwave generator is provided outside the plasma chamber for generating at least two microwave signals, wherein one dedicated antenna per signal protrudes radially into the plasma chamber for feeding linearly polarized microwaves. The antennas are arranged in the plasma chamber with a mutual angular offset alpha for the purpose of a phase-shifted feed of the microwaves to form a circularly polarized microwave. The phase shift of the microwave signals applied to the antennas is adapted to the angular offset of the antennas in the arrangement.

Preferably, two antennas are arranged on a circle of a circular cylindrical cross section of the plasma chamber with an angular offset alpha. The antennas are thus arranged in a cross-sectional plane of the circular cylindrical plasma chamber and protrude radially inwardly. Advantageously, the angular offset alpha is 90 degrees and causes a phase shift of the applied microwave signals of 90 degrees.

Particularly advantageously, the ECR ion source is designed so that coaxial cables can be arranged for transporting the linearly polarized microwaves from the microwave generator to the antennas in the plasma chamber.

Advantageously, the antennas for feeding the microwaves into the plasma chamber are formed as rod antennas, so that the microwaves can be fed into the plasma chamber via the rod antennas in a standardized, inexpensive and robust manner using a very simple setup.

The object of the invention is attained in particular with a method for operating an ECR ion source, wherein in a first step two microwaves signals are fed via coaxial cables to two antennas arranged with an angular offset alpha, and in a second step two linearly polarized microwaves are radiated via the antennas into the plasma chamber with a phase shift, whereby in the third step the linearly polarized microwaves are superimposed to form a circularly polarized microwave.

Preferably, the linearly polarized microwaves have a phase shift of 90°.

According to an advantageous embodiment, several linearly polarized microwaves are introduced into the plasma chamber in pairs with a phase shift alpha. Particularly preferred, the phase shift alpha is 90°.

According to a further advantageous embodiment of the invention, three antennas with mutual offsets of 120° are arranged in the plasma chamber, which then feed microwaves with a 120° phase shift.

Alternatively, a plurality of n antennas with mutual offsets of (360/n)° are arranged in the plasma chamber, with the phase shift of the applied signals being adjusted accordingly to (360/n)°.

The concept of the invention is that circularly polarized microwave radiation is fed into the cylindrical resonator space and used to heat the electrons. The electrons to be heated move in a spiral fashion around the field lines of the associated magnetic field in the ECR plasma chamber. To heat them efficiently, the direction of polarization of the microwave's electric field should match the direction of movement of the electrons. Therefore, the efficiency of the energy transfer can be increased by using not only a linear direction of polarization of the microwave radiation, which optimally serves the spiral path of the electrons only at a few points. According to the implementation of the concept, several linearly polarized waves that overlap with the correct phase shift are fed. This produces a circularly polarized wave that better matches the spiral motion of the electrons.

The essence of the invention is thus a superposition of a plurality of linearly polarized waves, fed by a plurality of antennas that protrude radially into the cylindrical plasma chamber. The respective phase shift is adapted to the geometrical positions of the antennas and corresponds to the angular offset of the antennas along the circular cross section of the cylinder. This generates a circularly polarized wave directly in the cylindrical chamber.

As a particular advantage, the circularly polarized wave is generated directly in the plasma chamber, without necessitating a waveguide for feeding the microwave, but rather by using flexible coaxial cables for transporting the microwaves to the ECR ion source. The use of coaxial cables for transporting the microwaves is particularly advantageous since the present technology trends towards semiconductor generators for microwave generation, which typically use coaxial outputs.

BRIEF DESCRIPTION OF THE DRAWINGS

Further details, features and advantages of embodiments of the invention result from the following description of exemplary embodiments with reference to the appended drawings, which show in:

FIG. 1: a longitudinal section through an ECR ion source, and

FIG. 2: a cross section of the plasma chamber of an ECR ion source.

DETAILED DESCRIPTION OF PREFERRED EMBODIMENTS

FIG. 1 shows schematically a longitudinal section of an ECR ion source 1. The ECR ion source 1 essentially consists of an evacuated plasma chamber 2, in which the plasma is generated. Furthermore, magnets 3 in the shape of ring magnets are arranged around the plasma chamber 2 on both sides of the circular-cylindrical plasma chamber with a spacing there between, in which the magnetic field lines 7 are then distributed, as indicated, and the plasma is generated in the enclosed area.

The circular cylinder of the plasma chamber 2 is closed on one side, while the aperture 6, through which the directed particle beam can exit the plasma chamber 2, is disposed on the other side. Linearly polarized microwaves are fed into the plasma chamber 2 via antennas 4, wherein the microwaves are generated outside of the ECR ion source 1 in a microwave generator 8 and supplied to the antennas 4 via a coaxial cable. 5 The antennas 4 protrude radially into the circular cylinder of the plasma chamber 2.

the illustrated exemplary embodiment, two antennas 4 are provided. The arrangement of the antennas 4 is central for the applied phase shift of the microwave signals, with their superposition producing particularly efficient circularly polarized microwaves, which are used to heat the electrons that move in the space between the magnets 3 around the magnetic field lines 7 in a spiral pattern.

FIG. 2 shows a schematic side view of a plasma chamber 2 in the plane of the antennas 4, with the circular cylindrical cross section clearly visible. According to the illustrated advantageous embodiment of the invention, two antennas 4 constructed as rod antennas protrude radially into the interior of the plasma chamber 3 with an angular offset alpha of 90 degrees on the circle. The antennas 4 are connected via coaxial cables 5 to the unillustrated microwave generator.

While the invention has been illustrated and described as embodied in an ECR ion source and operating an ECR ion source, it is not intended to be limited to the details shown since various modifications and structural changes may be made without departing in any way from the spirit of the present invention. The embodiments were chosen and described in order to best explain the principles of the invention and practical application to thereby enable a person skilled in the art to best utilize the invention and various embodiments with various modifications as are suited to the particular use contemplated.

What is claimed as new and desired to be protected by Letters Patent is set forth in the appended claims and their equivalents:

1. An ECR (Electron Cyclotron Resonance) ion source comprising:

a plasma chamber having a circular cylindrical cross-section, magnets for generating a magnetic field for confinement of a plasma in the plasma chamber, a microwave generator disposed outside the plasma chamber and generating microwave signals phase-shifted by 90°, and two rod-shaped antennas arranged on a circle of the circular-cylindrical cross section and protruding radially into the plasma chamber with an angular offset α of 90°, the antennas receiving the phase-shifted microwave signals from the microwave generator and radiating linearly polarized microwaves which in turn produce a circularly polarized microwave inside the plasma chamber.

2. The ECR ion source of claim 1, wherein the rod-shaped antennas form an antenna pair and several pairs of rod-shared antennas are arranged in different cross-sectional planes of the circular-cylindrical cross section of the plasma chamber.

3. The ECR ion source of claim 1, further comprising coaxial cables that transport the microwave signals from the microwave generator to the antennas.

4. A method for operating an ECR (Electron Cyclotron Resonance) ion source, comprising:
generating a magnetic field for confinement of a plasma in the plasma chamber;
feeding microwave signals phase-shifted by 90° via coaxial cables to two-rod-shaped antennas arranged inside the plasma chamber on a circular cylindrical cross-section of the plasma chamber and protruding radially into plasma chamber and having an angular offset α of 90°,
radiating with the antennas a linearly polarized microwaves phase-shifted by 90° into the plasma chamber, and
superimpose the phase-shifted linearly polarized microwaves inside the plasma chamber to form a circularly polarized microwave.

5. The method according to claim 4, wherein the rod-shaped-antennas form an antenna pair, and several antenna pairs are arranged in different cross-sectional planes of the circular-cylindrical cross section of the plasma chamber, and the microwave signals are applied to the antenna pairs with a mutual-phase shift α=90°.

* * * * *